United States Patent
Cen et al.

(10) Patent No.: US 11,355,391 B2
(45) Date of Patent: Jun. 7, 2022

(54) METHOD FOR FORMING A METAL GAPFILL

(71) Applicant: Applied Materials, Inc., Santa Clara, CA (US)

(72) Inventors: Xi Cen, San Jose, CA (US); Feiyue Ma, San Jose, CA (US); Kai Wu, Palo Alto, CA (US); Yu Lei, Belmont, CA (US); Kazuya Daito, Milpitas, CA (US); Yi Xu, San Jose, CA (US); Vikash Banthia, Los Altos, CA (US); Mei Chang, Saratoga, CA (US); He Ren, San Jose, CA (US); Raymond Hoiman Hung, Palo Alto, CA (US); Yakuan Yao, Campbell, CA (US); Avgerinos V. Gelatos, Scotts Valley, CA (US); David T. Or, Santa Clara, CA (US); Jing Zhou, San Jose, CA (US); Guoqiang Jian, Foster City, CA (US); Chi-Chou Lin, San Jose, CA (US); Yiming Lai, San Jose, CA (US); Jia Ye, San Jose, CA (US); Jenn-Yue Wang, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 8 days.

(21) Appl. No.: 16/803,842

(22) Filed: Feb. 27, 2020

(65) Prior Publication Data

US 2020/0303250 A1   Sep. 24, 2020

Related U.S. Application Data

(60) Provisional application No. 62/819,697, filed on Mar. 18, 2019.

(51) Int. Cl.
  *H01L 21/768*    (2006.01)
  *H01L 21/02*     (2006.01)
  *H01L 21/3213*   (2006.01)

(52) U.S. Cl.
  CPC .. *H01L 21/76877* (2013.01); *H01L 21/02266* (2013.01); *H01L 21/32136* (2013.01); *H01L 21/76847* (2013.01)

(58) Field of Classification Search
  None
  See application file for complete search history.

(56) References Cited

U.S. PATENT DOCUMENTS 5,399,530 A * 3/1995 Kenmotsu ......... H01L 21/76843
                                              438/625
5,695,810 A * 12/1997 Dubin ................. C23C 18/1603
                                              257/E21.584

(Continued)

FOREIGN PATENT DOCUMENTS

KR   20060016981 A   2/2006
KR   20090121662 A   11/2009

OTHER PUBLICATIONS

Wolf and Tauber, Silicon Processing for the VLSI Era, vol. 1: Process Technology, 2nd ed., Lattice Press, Sunset Beach, CA, 2000, pp. 438-443 ("Wolf") only for claims 7 and 14 (Year: 2000).*

(Continued)

*Primary Examiner* — Erik Kielin
(74) *Attorney, Agent, or Firm* — Patterson + Sheridan LLP (57) ABSTRACT

The present disclosure generally relates to methods for processing of substrates, and more particularly relates to methods for forming a metal gapfill. In one implementation, the method includes forming a metal gapfill in an opening using a multi-step process. The multi-step process includes forming a first portion of the metal gapfill, performing a (Continued)

sputter process to form one or more layers on one or more side walls, and growing a second portion of the metal gapfill to fill the opening with the metal gapfill. The metal gapfill formed by the multi-step process is seamless, and the one or more layers formed on the one or more side walls seal any gaps or defects between the metal gapfill and the side walls. As a result, fluids utilized in subsequent processes do not diffuse through the metal gapfill.

19 Claims, 4 Drawing Sheets (56) References Cited

U.S. PATENT DOCUMENTS

| | | | | |
|---|---|---|---|---|
| 6,066,558 | A * | 5/2000 | Kawano | H01L 21/76879 438/642 |
| 6,077,768 | A * | 6/2000 | Ong | H01L 21/76877 257/E21.585 |
| 6,528,409 | B1 * | 3/2003 | Lopatin | H01L 21/288 257/E21.174 |
| 7,781,327 | B1 * | 8/2010 | Kailasam | H01L 21/76805 438/622 |
| 7,964,504 | B1 | 6/2011 | Shaviv et al. | |
| 2002/0060362 | A1 * | 5/2002 | Miyamoto | H01L 23/53295 257/751 |
| 2002/0068461 | A1 * | 6/2002 | Kwon | H01L 21/76844 438/712 |
| 2006/0189115 | A1 * | 8/2006 | Sakai | H01L 21/76865 438/603 |
| 2012/0228125 | A1 * | 9/2012 | Wu | H01J 37/3405 204/192.15 |
| 2013/0260555 | A1 * | 10/2013 | Zope | H01L 23/53209 438/660 |
| 2017/0125353 | A1 * | 5/2017 | Chen | H01L 21/76816 |
| 2018/0350672 | A1 | 12/2018 | Shusterman et al. | |
| 2019/0080960 | A1 * | 3/2019 | Ho | H01L 21/76831 |
| 2019/0164887 | A1 * | 5/2019 | Wang | H01L 21/76802 |
| 2021/0090949 | A1 * | 3/2021 | Yu | H01L 23/53266 |

OTHER PUBLICATIONS

International Search Report dated Jun. 18, 2020 for Application No. PCT/US2020/020696.

* cited by examiner

METHOD FOR FORMING A METAL GAPFILL

CROSS-REFERENCE TO RELATED APPLICATIONS

This application claims the benefit to U.S. provisional application No. 62/819,697, filed Mar. 18, 2019, which is incorporated by reference herein.

BACKGROUND

Field

Implementations of the present disclosure generally relate to the processing of substrates, and more particularly relate to methods for forming a metal gapfill.

Description of the Related Art

In semiconductor processing, devices are being manufactured with continually decreasing feature dimensions. As device dimensions continue to shrink, and the two-dimensional limitations of Moore's Law become insurmountable, manufacturers are turning to three-dimensional structures to propel future growth. Devices such as fin field effect transistor (FinFETs) and three-dimensional memory devices such as dynamic random-access memory (DRAM) devices typically feature layers of different materials in a stack. Multiple devices or cells may be stacked one atop the other, and several devices are typically formed on one substrate. The layers are often different materials, so one structure may contain alternating layers of insulating, semiconducting, and metallic layers such as $SiO_2$, SiN, a-Si, and poly-Si. Typically the stack consists of 32 or 64, or even 128 layers of these alternating layers.

Certain metals, such as tungsten, have been used at contact level in logic application for about two decades. In recent advanced complementary metal-oxide-semiconductor (CMOS) devices, new technology such as metal gate and FinFET have emerged, which has led to a new application for these metals as metal gate fill for both p-type metal-oxide-semiconductor (PMOS) and n-type metal-oxide-semiconductor (NMOS) devices. In 3D NAND devices, such metals are also used for metal gate fill. The requirement for gapfill, using Tungsten for example, is becoming more and more challenging for several reasons. For example, for contact, the overhang becomes more challenging as the dimensions of contacts are getting smaller and because tungsten conformal fill typically leaves a seam. Furthermore, the seam will be exposed to slurry during chemical mechanical polishing (CMP), which causes integration issues. In addition, for metal gate trench in both advanced CMOS and 3D NAND, traditional tungsten conformal growth inevitably leaves a seam in the middle.

Therefore, an improved method of forming a metal gapfill is needed for both contact and metal gate fill in the advanced logic and memory devices.

SUMMARY

Implementations of the present disclosure generally relate to methods for processing of substrates, and more particularly relate to methods for forming a metal gapfill. In one implementation, a method for forming a metal gapfill includes forming a first portion of the metal gapfill over a surface of a first layer in an opening formed in a second layer, performing a sputtering process on the first portion, and forming a second portion of the metal gapfill to fill the opening with the metal gapfill.

In another implementation, a method for forming a metal gapfill includes forming a first portion of the metal gapfill over a surface of a first layer in an opening formed in a second layer, forming one or more layers on one or more side walls of the second layer, and forming a second portion of the metal gapfill to fill the opening with the metal gapfill.

In another implementation, a processing system includes a transfer chamber, a plurality of process chambers coupled to the transfer chamber, and a controller configured to cause a process to be performed in the processing system that includes forming a first portion of a metal gapfill over a surface of a first layer in an opening formed in a second layer, performing a sputtering process on the first portion, and forming a second portion of the metal gapfill to fill the opening with the metal gapfill.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The present disclosure generally relates to methods for processing of substrates, and more particularly relates to methods for forming a metal gapfill. In one implementation, which can include or be combined with one or more implementations described herein, the method includes forming a metal gapfill in an opening using a multi-step process. The multi-step process includes growing a first portion of the metal gapfill by a selective deposition process, performing a sputter process to form one or more layers on one or more side walls, and growing a second portion of the metal gapfill by a selective deposition process to fill the opening with the metal gapfill. The metal gapfill formed by the selective deposition processes is seamless, and the one or more layers formed on the one or more side walls seal any gaps or defects between the metal gapfill and the side walls. As a result, fluids utilized in subsequent processes do not diffuse through the metal gapfill to interact with a layer disposed under the metal gapfill.

Figure 1:
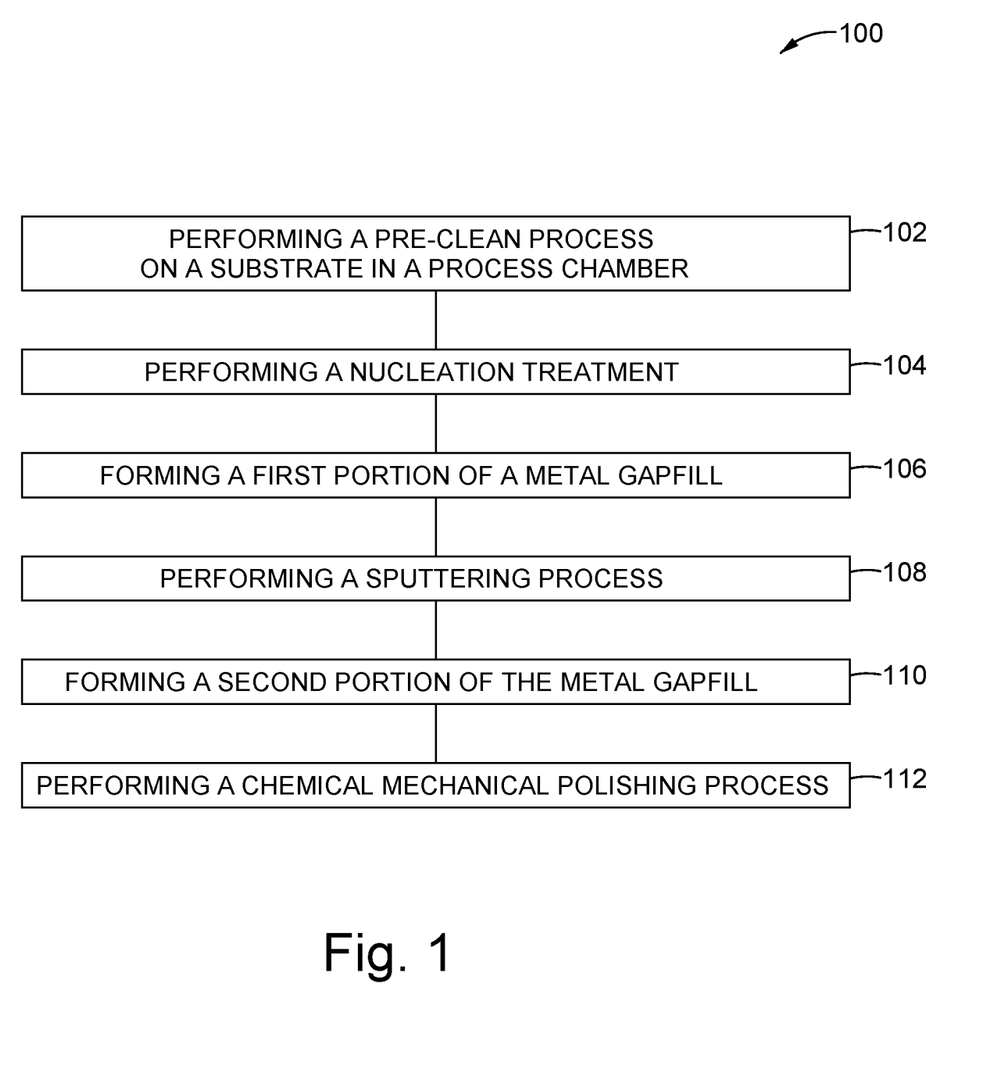
FIG. 1 is a flow diagram of a method for forming a metal gapfill, in accordance with one implementation.

FIG. 1 is a flow diagram of a method 100 for forming a metal gapfill. FIGS. 2A-2F illustrate various views of a substrate 200 during different stages of the method 100 of FIG. 1. It is noted that the method 100 may be utilized to form any other semiconductor structures not presented herein. Those skilled in the art should recognize that a full process for forming a semiconductor device and the associated structures are not illustrated in the drawings or described herein. Although various operations are illustrated in the drawings and described herein, no limitation regarding the order of such steps or the presence or absence of steps is implied. Operations depicted or described as sequential are, unless explicitly specified, merely done so for purposes of explanation without precluding the possibility that the respective steps are actually performed in concurrent or overlapping manner, at least partially if not entirely.

Figure 2A:
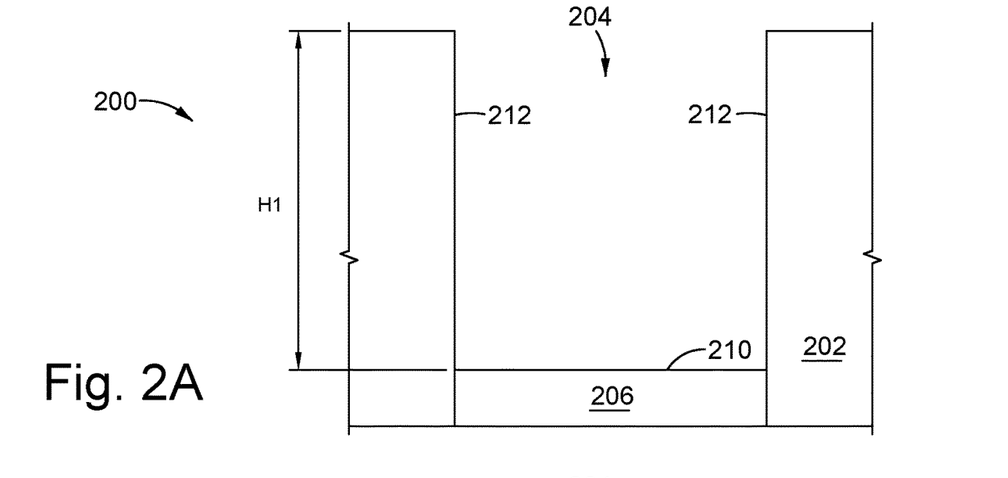
FIGS. 2A-2F illustrate various views of a substrate during different stages of the method of FIG. 1, in accordance with one implementation.

The method 100 starts at operation 102 by performing a pre-clean process on a substrate 200 in a process chamber. In one example, the process chamber is an etch chamber. As shown in FIG. 2A, the substrate 200 includes a first layer 202, at least one opening 204 formed in the first layer 202, and a second layer 206 disposed in the opening 204. The first layer 202 may be a dielectric layer that is fabricated from $SiO_2$, SiN, SiCN, $Al_2O_3$, AlN, or other suitable dielectric material. Alternatively, the first layer 202 may be a carbon layer in hardmask applications. The opening 204 may be a via or a trench, and the opening 204 is defined by a surface 210 of the second layer 206 and one or more side walls 212 of the first layer 202. The opening 204 has a height $H_1$. The second layer 206 may be fabricated from an electrically conductive material, such as a metal, a semiconductor, a conductive ceramic, or other suitable electrically conductive material. In one example, the second layer 206 is fabricated from cobalt, titanium nitride, or silicon.

The pre-clean process is performed on the surface 210 of the second layer 206. The pre-clean process is performed to remove contaminants, such as metal oxide, fluoride, carbon, polymer, or other post etch process residue, on the surface 210 of the second layer 206. The pre-clean process may be any suitable cleaning method, such as chemical clean or plasma clean. Chemical clean utilizes cleaning agents such as hydrogen radicals or reactive gas such as $H_2$, CO, $C_2H_5OH$, $WF_6$, $WCl_5$, or other suitable reactive gas. Some cleaning agents, such as hydrogen radicals, $H_2$, or CO, reduce the metal oxide contaminants back to metal. Some cleaning agents, such as $WF_6$ or $WCl_5$, etch the contaminants by volatilizing the contaminants into gases. In one example, the pre-clean process utilizes hydrogen radicals to reduce metal oxide such as $CoO_x$, $CuO_x$, and/or $WO_3$. Hydrogen radicals may be formed in a remote plasma source and then flowed with hydrogen gas or argon gas to the substrate 200. The substrate 200 may be maintained at a temperature ranging from about 200 degrees Celsius to about 400 degrees Celsius. In another example, the pre-clean process utilizes a $H_2$ thermal soak to reduce metal oxide such as $CoO_x$, $CuO_x$, and/or $WO_3$. The thermal soak process includes flowing hydrogen gas and argon gas into a process chamber, the chamber pressure ranges from about 30 Torr to about 300 Torr and the substrate 200 is maintained at a temperature ranging from about 300 degrees Celsius to about 600 degrees Celsius. In another example, the pre-clean process utilizes an ethanol soak to reduce metal oxide, and the substrate 200 is maintained at a temperature ranging from about 200 degrees Celsius to about 400 degrees Celsius. In another example, the pre-clean process utilizes a $WF_6$ or $WCl_5$ soak to react with the metal oxide and turn the metal oxide into gas/liquid phase metal compound (e.g., $WOF_4$, $CuCl_2$, $CoCl_2$) at high temperature and low pressure, and the substrate 200 is maintained at a temperature ranging from about 200 degrees Celsius to about 500 degrees Celsius.

The pre-clean process may be a plasma clean process. Plasma clean processes utilize Ar/He plasma or $H_2$ plasma. Some plasma clean processes physically sputter the contaminants away, while other plasma clean processes enhance the reaction to clean the surface 210. In one example, the pre-clean process utilizes argon plasma, and argon ions physically sputter the contaminants on the surface 210 of the second layer 206. The argon plasma may be capacitively coupled, inductively coupled, or the combination thereof. The plasma frequency ranges from about 350 kHz to about 40 MHz, the plasma power ranges from about 0 W to about 1000 W, and the chamber pressure ranges from about 10 mTorr to about 100 Torr. In another example, the pre-clean process utilizes hydrogen plasma, and hydrogen ions react with the contaminants on the surface 210 of the second layer 206 to form metal and water. The hydrogen plasma clean process has similar chemistry as the hydrogen thermal soak, but less thermal energy is utilized in the hydrogen plasma clean process.

In one example, the pre-clean process is performed in a process chamber using a remote plasma source. One example process chamber suitable for performing the pre-clean process is an AKTIV Pre-Clean™ chamber or a SICONI® clean chamber available from Applied Materials, Inc., Santa Clara, Calif. Alternatively, the pre-clean process is performed in an etch chamber, such as an etch chamber using an inductively coupled plasma (ICP) source. One example etch chamber may be a modified Decoupled Plasma Nitridation (DPN) chamber that is available from Applied Materials Inc., Santa Clara, Calif. However, it is contemplated that other suitably configured chambers from other manufacturers may also be implemented to perform the pre-clean process.

Figure 2B:
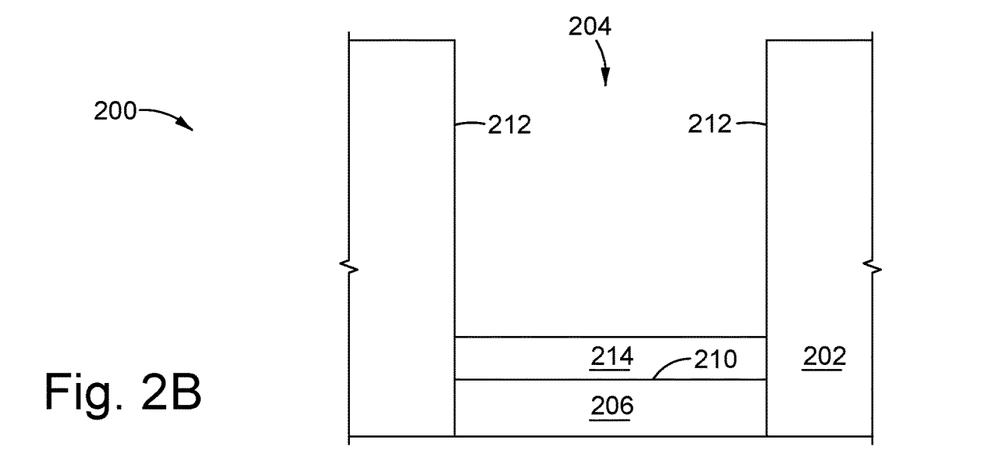

At operation 104, a nucleation treatment is performed on the cleaned surface 210 of the second layer 206. Nucleation treatment eliminates an incubation period of a metal gapfill to be formed on the surface 210 and in the opening 204, which also eliminates lattice mismatch because some metal growth incubation on different metal is very different. The nucleation treatment may include forming a metal seed layer 214 on the surface 210 of the second layer 206, as shown in FIG. 2B. The metal seed layer 214 may be fabricated from tungsten, cobalt, ruthenium, or other suitable metal. The metal seed layer 214 is formed by a selective process, so the metal seed layer 214 is not formed on the one or more side walls 212. In one example, the metal seed layer 214 is formed by a chemical soak process utilizing one or more gases such as $B_2H_6$, $SiH_4$, $Si_2H_6$, $WF_6$, $WCl_5$, $TiCl_4$, or other suitable gases. In another example, the metal seed layer 214 is formed by a selective metal atomic layer deposition (ALD) process. One or more precursors utilized in the selective metal ALD process include $B_2H_6$, $WF_6$, $H_2$, $SiH_4$, $WCl_5$, $W(CO)_6$, or other suitable precursors. In some implementations, one or more gases containing a metal other than tungsten are utilized. For example, cobalt or ruthenium containing gases may be utilized to form the metal seed layer 214. In some implementations, the nucleation treatment is omitted and the metal seed layer 214 is not present.

Figure 2C:
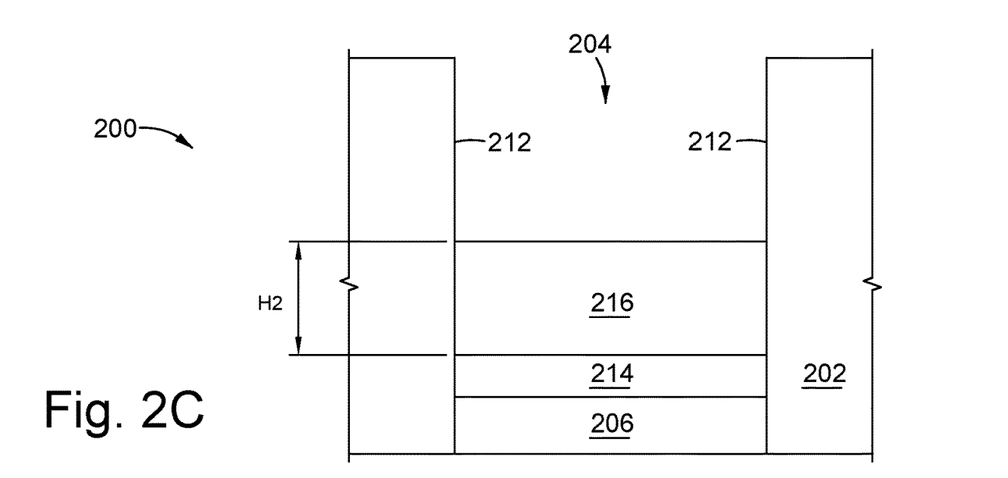

Next, at operation 106, a first portion 216 of a metal gapfill is formed on the metal seed layer 214, as shown in FIG. 2C. In some implementations, the first portion 216 of the metal gapfill is formed on the surface 210 of the second layer 206. The first portion 216 of the metal gapfill is fabricated from a metal, such as tungsten, cobalt, ruthenium, or other suitable metal. The first portion 216 is formed by a selective process and is grown from bottom-up. In other words, the first portion 216 is selectively formed on, or grown from, the metal seed layer 214 or the surface 210 of the second layer 206 and is not formed on the one or more side walls 212. The first portion 216 is in contact with a portion of the one or more side walls 212, as shown in FIG. 2C, but the first portion 216 is not grown from the one or more side walls 212. The first portion 216 has a height $H_2$, and the height $H_2$ is about 10 percent to about 50 percent of the height $H_1$ of the opening 204.

The selective process for forming the first portion 216 may be a chemical vapor deposition (CVD) process, and the selectivity is based on the chamber pressure and the ratio of precursor gases. In one example, the selective process includes flowing a metal containing gas and a second gas into a process chamber. The metal containing gas may be any suitable metal containing gas, such as $WF_6$. The second gas may be hydrogen gas. The ratio of the second gas to the metal containing gas ranges from about six to one to about 8000 to one. The chamber pressure ranges from about 1 Torr to about 300 Torr, and the substrate is maintained at a temperature ranging from about 200 degrees Celsius to about 500 degrees Celsius. Chamber pressure and ratio of the gases can affect the selectivity. In one example, at a relatively high temperature, such as greater than about 400 degrees Celsius, the selectivity is maintained when the ratio of the second gas to the metal containing gas is high and the chamber pressure is low.

Figure 2D:
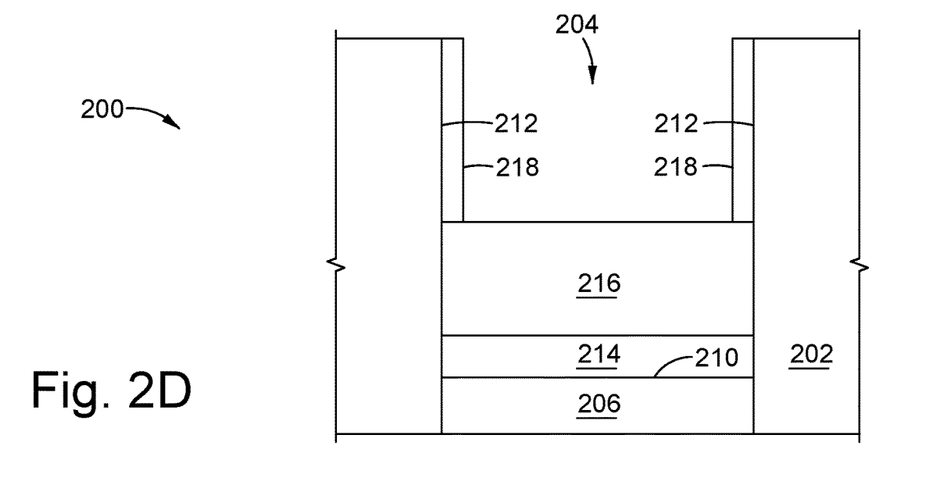

Next, at operation 108, a sputtering process is performed to remove some of the first portion 216 of the metal gapfill and to form one or more layers 218 on the one or more side walls 212, as shown in FIG. 2D. The sputtering process may have the same processing conditions as the pre-clean process that utilizes argon plasma. The sputtering process sputters some of the first portion 216 of the metal gapfill onto the one or more side walls 212. As a result, the layer 218 is formed on each side wall 212. The layer 218 is fabricated from the same material as the first portion 216 of the metal gapfill.

Figure 2E:
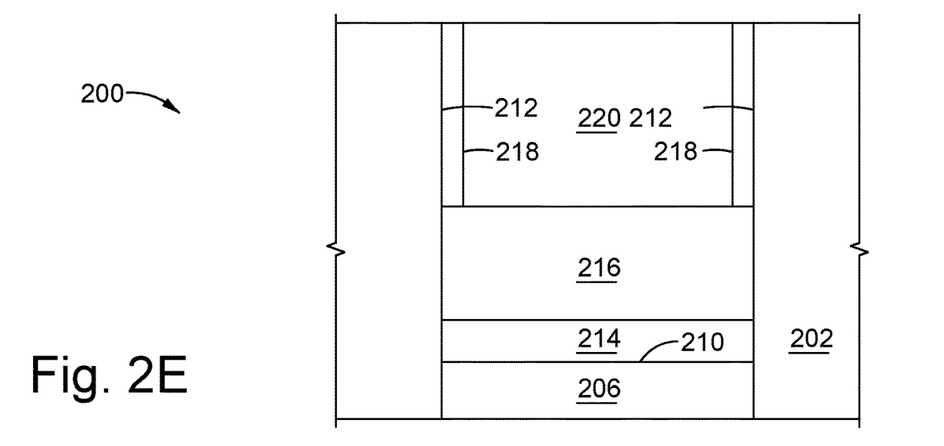

Next, at operation 110, a second portion 220 of the metal gapfill is formed on the first portion 216 of the metal gapfill, as shown in FIG. 2E. The second portion 220 may be formed by the same process as that for the first portion 216 of the metal gapfill. The second portion 220 is fabricated from the same material as the first portion 216. The metal gapfill formed in the opening 204 includes the first portion 216, the one or more layers 218, and the second portion 220. The multi-step process to form the metal gapfill is seamless, and there are no gaps or defects between the metal gapfill and the side walls 212. As a result, fluids utilized in subsequent processes do not diffuse through the metal gapfill to interact with the second layer 206.

Figure 2F:
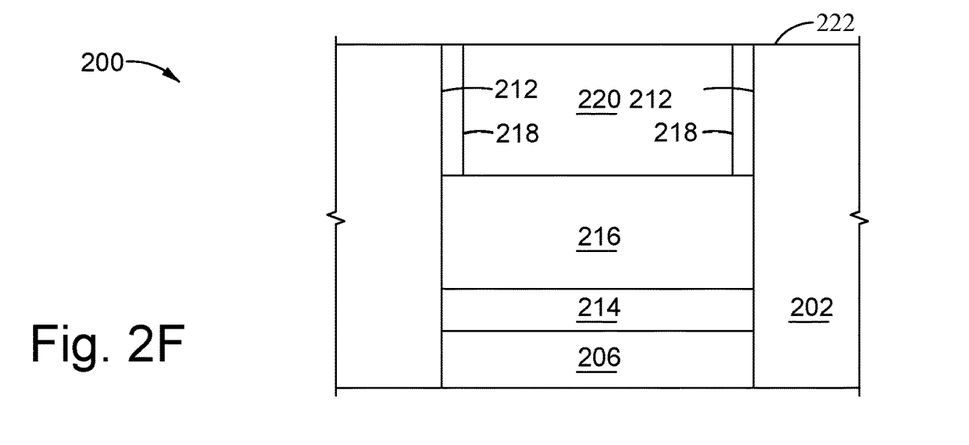

Next, at operation 112, a chemical mechanical polishing (CMP) process is performed on the substrate 200 to form a planar surface 222, as shown in FIG. 2F. During the CMP process, the slurry does not diffuse through the metal gapfill having the first portion 216, the layers 218, and the second portion 220 because the side walls 212 are sealed by the layers 218. As such, the second layer 206 is protected from the slurry in the CMP process.

Referring back to FIG. 1, operations 106, 108, and 110 are performed to form a seamless metal gapfill, and there are no gaps or defects between the metal gapfill and the side walls. In some implementations, operations 106, 108, and 110 are replaced with a single operation, which is to form a single phase crystal metal gapfill from bottom-up. The single phase crystal metal gapfill does not have any grain boundary formed therein, and the resistivity of the metal gapfill is independent of the size of the opening 204. Thus, the single phase crystal metal gapfill is seamless and has reduced electrical resistance. The single phase crystal metal gapfill may be formed by a CVD process in which the substrate 200 is maintained at a temperature greater than or equal to 450 degrees Celsius.

Figure 3:
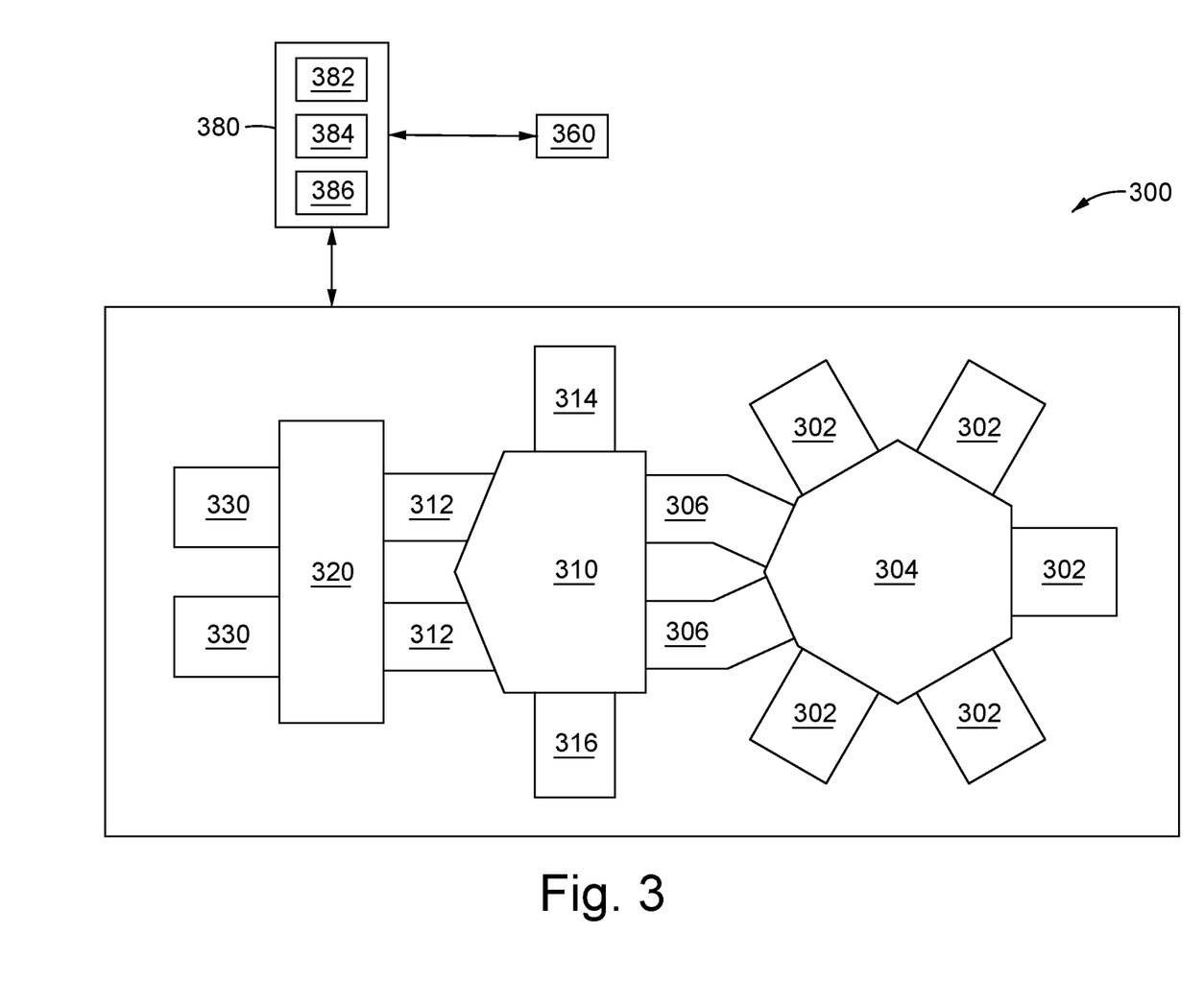
FIG. 3 is a schematic top-view diagram of an example multi-chamber processing system suitable for performing the method of FIG. 1, in accordance with one implementation.

Examples of a processing system that may be suitably modified in accordance with the teachings provided herein include the ENDURA®, PRODUCER® or CENTURA® integrated processing systems or other suitable processing systems commercially available from Applied Materials, Inc., located in Santa Clara, Calif. It is contemplated that other processing systems (including those from other manufacturers) may be adapted to benefit from aspects described herein. FIG. 3 illustrates a schematic top-view diagram of an example multi-chamber processing system 300 that can be used to complete the method 100 illustrated in FIG. 1, according to implementations of the present disclosure. As shown in FIG. 3, a plurality of process chambers 302 is coupled to a first transfer chamber 304. The first transfer chamber 304 is also coupled to a first pair of pass-through chambers 306. The first transfer chamber 304 has a centrally disposed transfer robot (not shown) for transferring substrates between the pass-through chambers 306 and the process chambers 302. The pass-through chambers 306 are coupled to a second transfer chamber 310, which is coupled to a process chamber 314 that is configured to perform a pre-clean process, such as the operation 102, and a process chamber 316 that is configured to perform a nucleation treatment operation, such as the operation 106. The second transfer chamber 310 has a centrally disposed transfer robot (not shown) for transferring substrates between a set of load lock chambers 312 and the process chamber 314 or the process chamber 316. A factory interface 320 is connected to the second transfer chamber 310 by the load lock chambers 312. The factory interface 320 is coupled to one or more pods 330 on the opposite side of the load lock chambers 312. The pods 330 typically are front opening unified pods (FOUP) that are accessible from a clean room.

During operation, a substrate is first transferred to the process chamber 314 where a pre-clean process, such as the operation 102, is performed to remove contaminants, such as metal oxide contaminant from a bottom of an opening. Then the substrate is transferred to the process chamber 316 where operation 106 is performed. The substrate is then transferred to one or more process chambers 302 in which the operations 106, 108, and 110 are performed. Because all of the operations 102, 104, 106, 108, 110 are performed within the same processing system 300, vacuum is not broken as the substrate is transferred to various chambers, which decreases the chance of contamination and improves the quality of the metal gapfill.

A system controller 380 is coupled to the processing system 300 for controlling the processing system 300 or components thereof. For example, the system controller 380 may control the operations of the processing system 300 using a direct control of the chambers 302, 304, 306, 310, 312, 314, 316 of the processing system 300 or by controlling a controller 360 associated with the chambers 302, 304, 306, 310, 312, 314, 316. In operation, the system controller 380 enables data collection and feedback from the respective chambers to coordinate performance of the processing system 300.

The system controller 380 generally includes a central processing unit (CPU) 382, memory 384, and support circuits 386. The CPU 382 may be one of any form of a general purpose processor that can be used in an industrial setting. The memory 384, non-transitory computer-readable medium, or machine-readable storage device, is accessible by the CPU 382 and may be one or more of memory such as random access memory (RAM), read only memory (ROM), floppy disk, hard disk, or any other form of digital storage, local or remote. The support circuits 386 are coupled to the CPU 382 and may comprise cache, clock circuits, input/output subsystems, power supplies, and the like. The system controller 380 is configured to perform the method 100 stored in the memory 384. The various implementations disclosed in this disclosure may generally be implemented under the control of the CPU 382 by executing computer instruction code stored in the memory 384 (or in memory of a particular process chamber) as, e.g., a computer program product or software routine. That is, the computer program product is tangibly embodied on the memory 384 (or non-transitory computer-readable medium or machine-readable storage device). When the computer instruction code is executed by the CPU 382, the CPU 382 controls the chambers to perform operations in accordance with the various implementations.

In summary, implementations of the present disclosure enable formation of a seamless metal gapfill that prevents any fluids from diffusing therethrough. The seamless metal gapfill is formed by a multi-step process that includes growing a first portion of the metal gapfill by a selective deposition process, performing a sputter process to form one or more layers on one or more side walls, and growing a second portion of the metal gapfill by a selective deposition process to fill the opening with the metal gapfill. The metal gapfill formed by the selective deposition processes is seamless, and the one or more layers formed on the one or more side walls seal any gaps or defects between the metal gapfill and the side walls. As a result, fluids utilized in subsequent processes do not diffuse through the metal gapfill.

While the foregoing is directed to implementations of the present disclosure, other and further implementations of the disclosure may be devised without departing from the basic scope thereof, and the scope thereof is determined by the claims that follow.

What is claimed is:

1. A method for forming a metal gapfill, the method comprising:
    forming a second layer between side walls of an opening formed in a first layer;
    forming a first portion of the metal gapfill selectively on a first surface of the second layer, the first surface being between the side walls of the opening, the first portion comprising a material comprising a first metal;
    sputtering the first metal from the first portion onto the side walls of the opening to form a layer that is in direct contact with the side walls of the opening and the first portion; and
    forming a second portion of the metal gapfill to fill the opening with the metal gapfill, wherein the second portion is the same material as the first portion, wherein the first metal comprises cobalt, tungsten, or ruthenium.

2. The method of claim 1, wherein the sputtering of the first metal is performed in a chamber with pressure of between 10 mTorr and 100 Torr.

3. The method of claim 1, wherein the second layer comprises a second metal.

4. The method of claim 1, wherein the first layer comprises a dielectric layer.

5. The method of claim 1, further comprising performing a pre-clean process on the first surface of the second layer prior to forming the first portion of the metal gapfill.

6. The method of claim 5, further comprising forming a metal seed layer on the first surface of the second layer, wherein the first portion of the metal gapfill is formed on the metal seed layer.

7. The method of claim 1, wherein the sputtering process utilizes argon plasma.

8. A method for forming a metal gapfill, the method comprising:
    forming a second layer between side walls of an opening formed in a first layer;
    forming a first portion of the metal gapfill selectively on a first surface of the second layer, the first surface being between the side walls of the opening, and the first portion comprising a material comprising a first metal;
    forming a layer that is in direct contact with the side walls of the opening and the first portion, the layer comprising the first metal; and
    forming a second portion of the metal gapfill to fill the opening with the metal gapfill, wherein the second portion is the same material as the first portion,
    wherein the first metal comprises cobalt, tungsten, or ruthenium.

9. The method of claim 8, wherein the layer is formed by a sputtering process that utilizes argon plasma.

10. The method of claim 8, wherein the second layer comprises a second metal.

11. The method of claim 8, wherein the first layer comprises a dielectric layer.

12. The method of claim 8, further comprising performing a pre-clean process on the first surface of the second layer prior to forming the first portion of the metal gapfill.

13. The method of claim 12, further comprising forming a metal seed layer on the first surface of the second layer, wherein the first portion of the metal gapfill is formed on the metal seed layer.

14. The method of claim 9, wherein the sputtering process is performed in a chamber with pressure of between 10 mTorr and 100 Torr.

15. A processing system comprising:
    a transfer chamber;
    a plurality of process chambers coupled to the transfer chamber; and
    a controller configured to cause a process to be performed in the processing system that includes:
        forming a second layer between side walls of an opening formed in a first layer;
        forming a first portion of a metal gapfill selectively on a first surface of the second layer, the first surface being between the side walls of the opening, the first portion comprising a first material comprising a first metal;
        performing a sputtering process on the first portion to partially remove the first portion of the metal gapfill and to form a layer that is in direct contact with the side walls of the opening and the first portion; and
        forming a second portion of the metal gapfill to fill the opening with the metal gapfill, wherein the second portion is the same material as the first portion,
        wherein the first metal is selected from cobalt, tungsten, or ruthenium.

16. The processing system of claim 15, wherein the second layer comprises a second metal.

17. The processing system of claim 15, wherein the first layer comprises a dielectric layer.

18. The processing system of claim 15, further comprising performing a pre-clean process on the first surface of the first layer prior to forming the first portion of the metal gapfill.

19. The processing system of claim 18, further comprising forming a metal seed layer on the first surface of the first layer, wherein the first portion of the metal gapfill is formed on the metal seed layer.

\* \* \* \* \*